(12) United States Patent
Hu

(10) Patent No.: US 6,181,169 B1
(45) Date of Patent: Jan. 30, 2001

(54) HIGH-SPEED RAIL-TO-RAIL COMPARATOR

(75) Inventor: Ting-Li Hu, Taichung (TW)

(73) Assignee: Integrated Technology Express, Inc., Hsinchu (TW)

( * ) Notice: Under 35 U.S.C. 154(b), the term of this patent shall be extended for 0 days.

(21) Appl. No.: 09/429,334

(22) Filed: Oct. 28, 1999

(51) Int. Cl.$^7$ ............................ G01K 19/00; H03K 5/153
(52) U.S. Cl. ........................................... 327/77; 327/53
(58) Field of Search ................................. 327/52, 53, 56, 327/60, 61, 63–66, 68–70, 72, 77–82, 88, 89, 90, 205; 323/315, 316

(56) References Cited

U.S. PATENT DOCUMENTS

| | | | |
|---|---|---|---|
| 4,653,029 | * 3/1987 | Sato | 365/205 |
| 4,999,567 | * 3/1991 | Morigami | 323/313 |
| 5,311,071 | * 5/1994 | Ueda | 327/63 |
| 5,812,022 | * 9/1998 | Hirano et al. | 327/563 |
| 5,990,709 | * 11/1999 | Thewes et al. | 327/89 |
| 6,104,216 | * 8/2000 | Satoh | 327/78 |

* cited by examiner

Primary Examiner—My-Trang Nuton

(74) Attorney, Agent, or Firm—Jiawei Huang; J C Patents

(57) ABSTRACT

A high-speed rail-to-rail comparator is described. The comparator has two PMOS transistors, two NMOS transistors, a current source and two voltage-dropped components. A first PMOS transistor has a source terminal coupled to a first voltage source and a gate terminal and a drain terminal coupled to each other. A second PMOS transistor has a source terminal coupled to the first voltage source, and a gate terminal of the second PMOS transistor coupled to the gate terminal of the first PMOS transistor. A first NMOS transistor has a drain terminal coupled to the drain terminal of the first PMOS transistor and a gate terminal coupled to a reference signal. A second NMOS transistor has a drain terminal of the first NMOS transistor coupled to the drain terminal of the second PMOS transistor and coupled to an output terminal. A gate terminal of the second NMOS transistor is coupled to an input terminal and a source terminal of the second NMOS transistor is coupled to a source terminal of the first NMOS transistor. A first voltage-dropped component has a positive terminal coupled to the gate terminal of the second PMOS transistor and a negative terminal coupled to the drain terminal of the second NMOS transistor. A second voltage-dropped component has a positive terminal coupled to the drain terminal of the second NMOS transistor while a negative terminal of the second voltage-dropped component is coupled to the source terminal of the second NMOS transistor.

16 Claims, 4 Drawing Sheets

US 6,181,169 B1

HIGH-SPEED RAIL-TO-RAIL COMPARATOR

CROSS-REFERENCE TO RELATED APPLICATION

This application claims the priority benefit of Taiwan application serial No. 88113713, filed Aug. 11,1999.

BACKGROUND OF THE INVENTION

1. Field of the Invention

This invention is related to a comparator, and is more particularly related to a high-speed rail-to-rail comparator.

2. Description of Related Art

Reference is made to FIG. 1A, which shows a circuit of a conventional analog comparator. The comparator 5 includes two p-type metal oxide semiconductor (PMOS) transistors and two n-type metal oxide semiconductor (NMOS) transistors. As shown in FIG. 1 A, a PMOS transistor 10 and a PMOS 20 are used for active loads. The comparator 5 is coupled to a reference signal Vref (Vss<Vref<Vcc) through a gate terminal of a NMOS transistor 30, an input signal Vin through a NMOS transistor 40 and an output signal Vout through a drain terminal of the NMOS transistor 40. The comparator 5 is also coupled to a fixed current source Is.

When the voltage level of the input signal Vin is larger than the Vref, the NMOS transistor 30 is closed and the NMOS transistor 40 is opened, and then the voltage level of the output signal Vout is very close to Vss. When the voltage level of the input signal Vin is smaller than Vref, the NMOS transistor 30 is opened and the NMOS transistor 40 is closed, and then the voltage level of the output signal Vout is also very close to Vcc.

The voltage level of the input signal Vin of the conventional comparator 5 is limited to a value between Vss and Vcc. If the voltage level of the input signal Vin is Vcc, the output signal Vout is very close to Vss; when the input signal Vin is rapidly changed to Vss, Vout is raised from a voltage level close to Vss and is raised to Vcc. By a similar manner, when the input signal Vin is rapidly changed from Vss to Vcc, Vout is decreased from a voltage level close to Vcc and is changed to Vss. A schematic diagram of a curve for Vin-Vout is shown in FIG. 1B.

The swing range of the input signal Vin in the conventional comparator 5 is rail-to-rail, which is a voltage from Vcc to Vss or from Vss to Vcc. The swing range of the output signal Vout is larger in the conventional comparator. Therefore, a longer time is necessary in response to output a comparison result, which is a drawback for the comparator when used in a high-speed circuit.

Reference is made to FIG. 2A, which shows a conventional comparator 55 manifesting a phenomenon of magnetic hysteresis. The comparator 55 includes four PMOS transistors and two NMOS transistors. The PMOS transistors 52 and 54 are used as a active load 50. The PMOS transistors 62 and 64 are used as another active load 60. The comparator 55 is coupled to a reference signal Vref (Vss<Vref<Vcc) through a gate terminal of a NMOS transistor 70, an input signal Vin through a NMOS transistor 80 and an output signal Vout through a drain terminal of the NMOS transistor 80. The comparator 55 is also coupled to a fixed current source Is.

In the circuit of the comparator 55, when the device parameter $K_{54}$ of the PMOS transistor 54 (device parameter $$K = \frac{1}{2} \mu_n C_{OX} \left( \frac{W}{L} \right)$$

) is larger than the device parameter $K_{52}$ of the PMOS transistor 52, and the device parameter $K_{64}$ of the PMOS transistor 64 is larger than the device parameter $K_{62}$ of the PMOS transistor 62, as well, the phenomenon of magnetic hysteresis occurs in the comparator.

Reference is made to FIG. 2B, which shows a schematic diagram of a curve for Vin-Vout in a comparator manifesting a phenomenon of magnetic hysteresis. The comparator has two reference voltages V⁺ref and V⁻ref. When the voltage level of the input signal is larger than the reference voltages V⁺ref, the voltage level of the output signal is decreased from about Vcc to about Vss. When the voltage level of the input signal is smaller than the reference voltages V⁻ref, the voltage level of the output signal is increased from about Vss to about Vcc. The swing range of the output signal of the comparator with the phenomenon of magnetic hysteresis is very large; therefore, a longer time is required to respond and to output an accurate result. This longer time is also a draw-back for the comparator when used in a high-speed circuit.

SUMMARY OF THE INVENTION

The invention provides a high-speed rail-to-rail comparator, in which a voltage-dropped component is employed between connection of the output terminal and the active loads of the comparator. By employing the voltage-dropped component, a voltage level of the output terminal of the comparator can be easily controlled at a required level.

The invention provides a high-speed rail-to-rail comparator, in which a voltage-dropped component is employed between connection of the output terminal and the common source terminal of the comparator. By employing the voltage-dropped component, a swing range of the output voltage of the comparator can be controlled and limited, by which the transferring speed of the output of the comparator can be easily faster than that in the conventional comparator. This invention is therefore suitable for application in a high-speed circuit.

In accordance with the foregoing and other objectives of the present invention, a high-speed rail-to-rail comparator is provided. The comparator comprises two PMOS transistors, two NMOS transistors, a current source and two voltage-dropped components. A first PMOS transistor is provided. A source terminal of the PMOS transistor is coupled to a first voltage source, and a gate terminal and a drain terminal of the first PMOS transistor are coupled to each other. A second PMOS transistor is also provided. A source terminal of the second PMOS transistor is coupled to the first voltage source, and a gate terminal of the second PMOS transistor is coupled to the gate terminal of the first PMOS transistor. A first NMOS transistor has a drain terminal coupled to the drain terminal of the first PMOS transistor and a gate terminal coupled to a reference signal. A second NMOS transistor has a drain terminal coupled to the drain terminal of the second PMOS transistor and coupled to an output terminal, while a gate terminal of the second NMOS transistor is coupled to an input terminal and a source terminal of the second NMOS transistor is coupled to a source terminal of the first NMOS transistor. A current source has a current source that is coupled to the source terminal of the first NMOS transistor, while an output terminal of the current source is coupled to a second voltage source and the voltage provided by the first voltage source is larger than the voltage provided by the second voltage source. A first voltage-dropped component has a positive terminal of the first voltage-dropped component coupled to the gate terminal of the second PMOS transistor and a negative terminal of the first voltage-dropped component is coupled to the drain terminal of the second NMOS transistor. A second voltage-dropped component has a positive terminal coupled to the drain terminal of the second NMOS transistor and a negative terminal coupled to the source terminal of the second NMOS transistor.

In accordance with the foregoing and other objectives of the present invention, a high-speed rail-to-rail comparator is provided. The comparator comprises four PMOS transistors, four NMOS transistors, a current source and four voltage-dropped components. A first PMOS transistor has a source terminal coupled to a first voltage source. A second PMOS transistor has a source terminal coupled to the first voltage source, and a gate terminal of the PMOS transistor is coupled to a gate terminal of the first PMOS transistor. A third PMOS transistor has a source terminal coupled to the first voltage source, and a drain terminal of the third PMOS transistor is coupled to a drain terminal of the second PMOS transistor. A fourth PMOS transistor has a source terminal coupled to the first voltage source and a gate terminal coupled to a gate terminal of the third PMOS transistor. A drain terminal of the fourth PMOS transistor is coupled to a drain terminal of the first PMOS transistor. A first NMOS transistor has a drain terminal coupled to a drain terminal of the first PMOS transistor and a gate terminal of the first NMOS transistor is coupled to a reference signal. A second NMOS transistor has a drain terminal coupled to the drain terminal of the third PMOS transistor and an output terminal. A gate terminal of the second NMOS transistor is coupled to a input terminal and a source terminal of the second NMOS transistor is coupled to a source terminal of the first NMOS transistor. A current source has an input terminal coupled to the source terminal of the first NMOS transistor, wherein an output terminal of the current source is coupled to a second voltage source. A first voltage-dropped component is coupled between a gate terminal of the first PMOS transistor and the source terminal of the first NMOS transistor. A positive terminal of the first voltage-dropped component is coupled to the gate terminal of the first PMOS transistor and a negative terminal of the first voltage-dropped component is coupled to the drain terminal of the first NMOS transistor. A second voltage-dropped component is coupled between the drain terminal of the first NMOS transistor and the source terminal of the first NMOS transistor. A positive terminal of the first voltage-dropped component is coupled to the drain terminal of the first NMOS transistor and a negative terminal of the first voltage-dropped component is coupled to the source terminal of the first NMOS transistor. A third voltage-dropped component is coupled between the gate terminal of the third PMOS transistor and the drain terminal of the second NMOS transistor. A positive terminal of the first voltage-dropped component is coupled to the gate terminal of the third PMOS transistor and a negative terminal of the first voltage-dropped component is coupled to the drain terminal of the second NMOS transistor. A fourth voltage-dropped component is coupled between the drain terminal of the second NMOS transistor and the source terminal of the second NMOS transistor. A positive terminal of the first voltage-dropped component is coupled to the drain terminal of the second NMOS transistor and a negative terminal of the first voltage-dropped component is coupled to the source terminal of the second NMOS transistor.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENT

First Embodiment

Figure 1A:
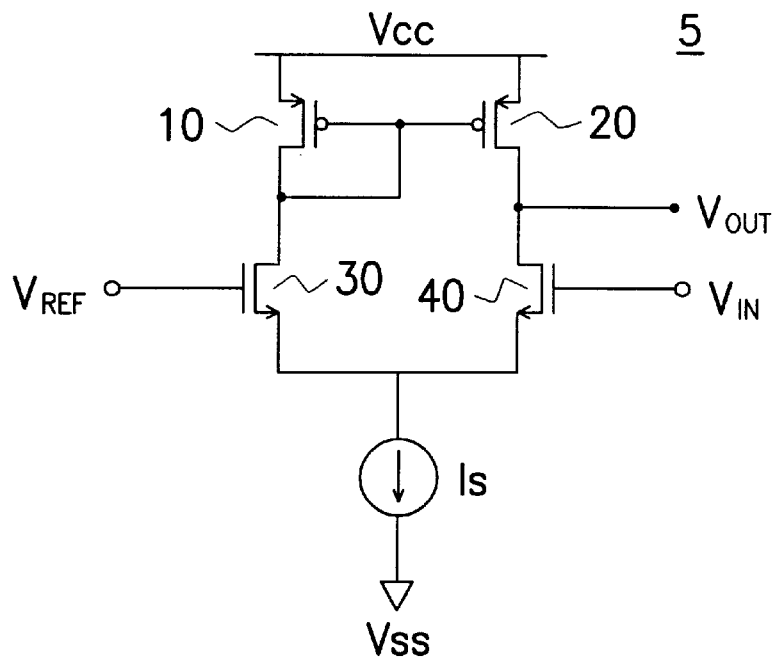
FIG. 1A is a diagram of a circuit of a conventional analog comparator.
Figure 1B:
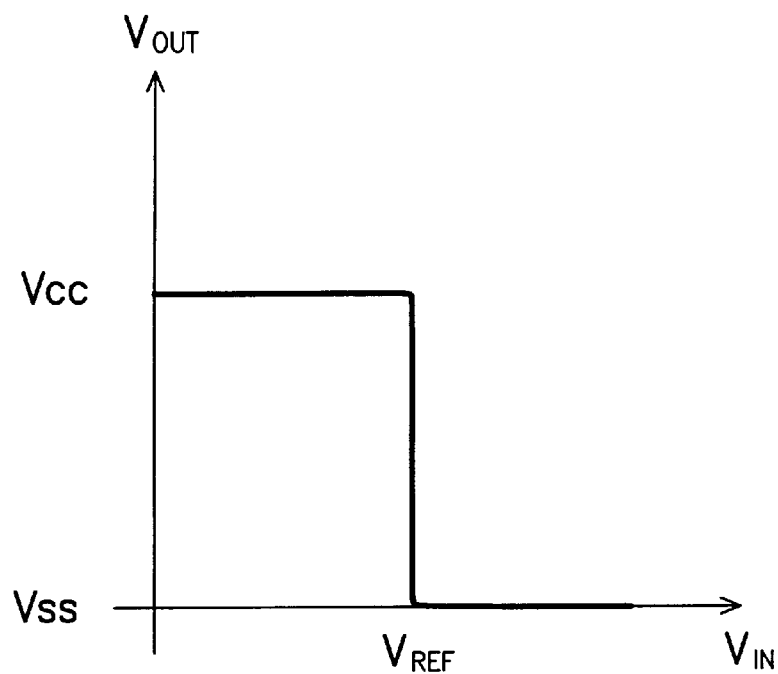
FIG. 1B is a schematic diagram of a curve of Vin-Vout in FIG. 1A.
Figure 2A:
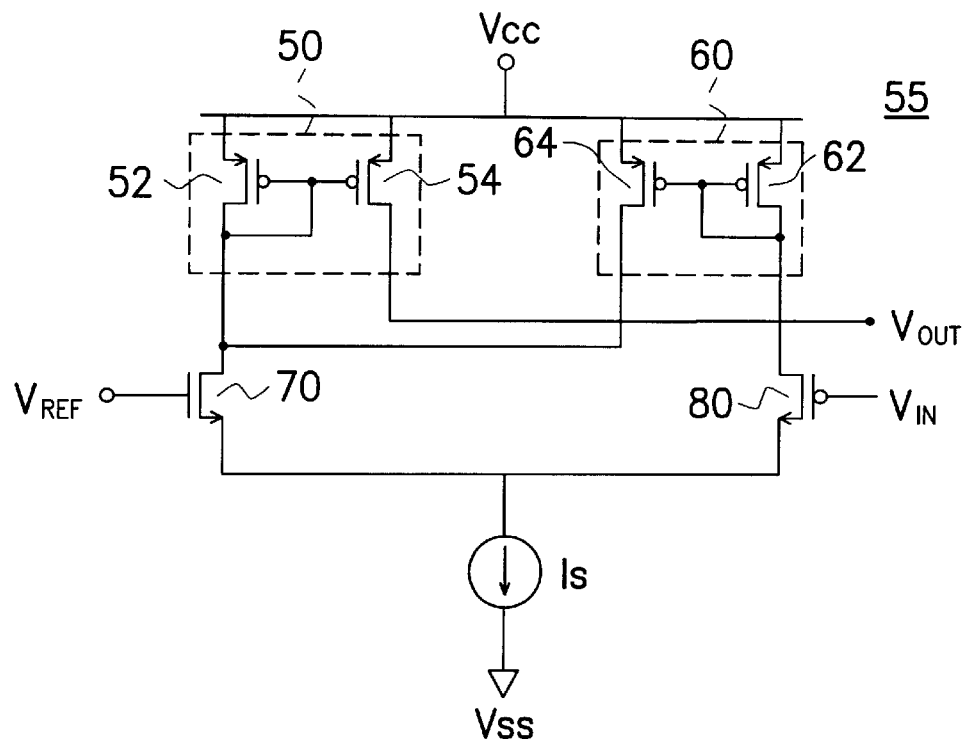
FIG. 2A is a diagram of a circuit of a conventional comparator with a phenomenon of magnetic hysteresis.
Figure 2B:
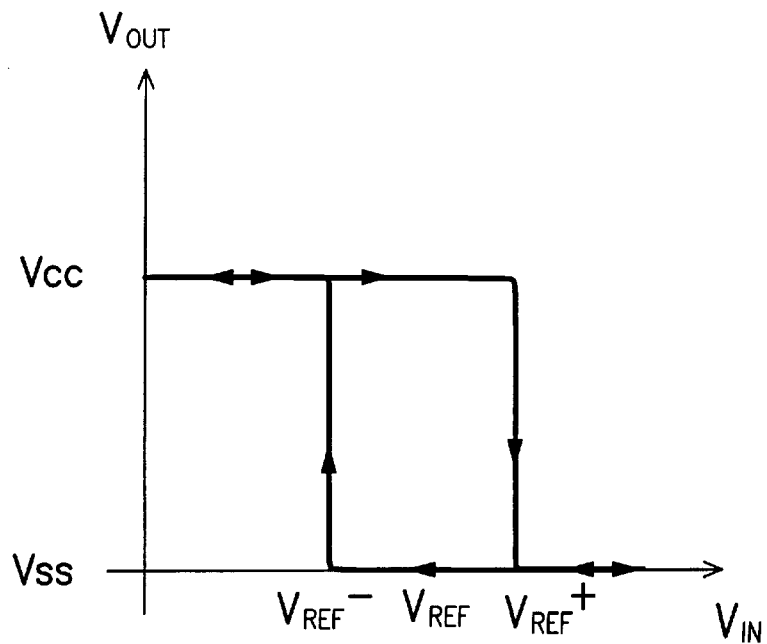
FIG. 2B is a schematic diagram of a curve of Vin-Vout in the comparator with a phenomenon of magnetic hysteresis of FIG. 2A.
Figure 3A:
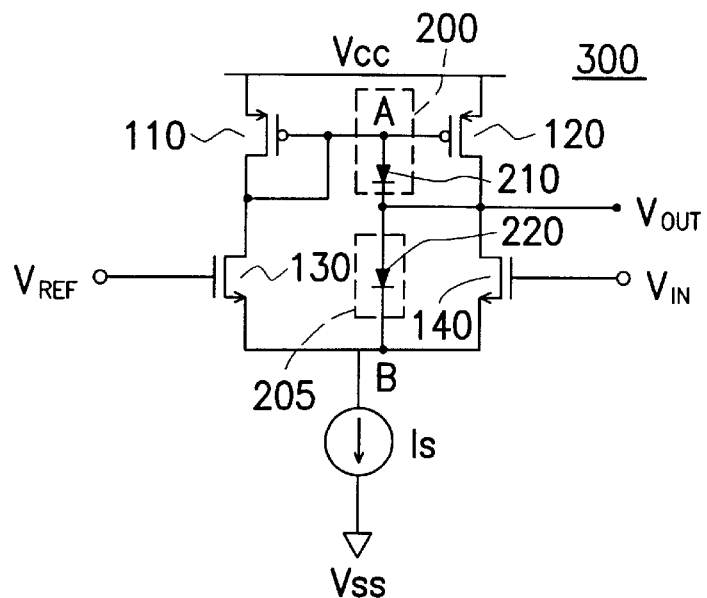
FIG. 3A a diagram of a high-speed rail-to-rail comparator of a first preferred embodiment of the invention.

Reference is made to FIG. 3A, which shows a high-speed rail-to-rail comparator 300 of a first preferred embodiment of the invention. The comparator 300 includes two PMOS transistors, two NMOS transistors and two diodes. As shown in FIG. 3A, a source terminal of a PMOS transistor 110 is coupled to a higher voltage source Vcc. A gate terminal and a drain terminal of the PMOS transistor 110 are connected to each other. A source terminal of a PMOS transistor 120 is coupled to the higher voltage source Vcc. A gate terminal of the PMOS transistor 120 is connected to the gate terminal of the PMOS transistor 110. A gate terminal of a NMOS transistor 130 is coupled to the drain terminal of the PMOS transistor 110, and a gate terminal of the NMOS transistor 130 is coupled to a reference voltage Vref. A drain terminal of a NMOS transistor 140 is coupled to the drain terminal of the PMOS transistor 120 as well as an output signal Vout. A gate terminal of the NMOS transistor 140 is coupled to an input signal Vin. A source terminal of the NMOS transistor 140 is coupled to the source terminal of the NMOS transistor 130. A output terminal of a fixed current source Is is coupled to a lower voltage source Vss. Voltage-dropped components 200 and 205 are provided in the comparator 300 of the first embodiment, as shown in FIG. 3a. The voltage-dropped component 200 includes, for example, a diode 210. The voltage-dropped component 205 includes, for example, a diode 220. The positive terminal of the diode 210 is coupled to the gate terminal of the PMOS transistor 120. The negative terminal of the diode 210 is coupled to the drain terminal of the NMOS transistor 140. The positive terminal of the diode 220 is coupled to the drain terminal of NMOS transistor 140. The negative terminal of the diode 220 is coupled to the source terminal of the NMOS transistor 140.

Figure 3B:
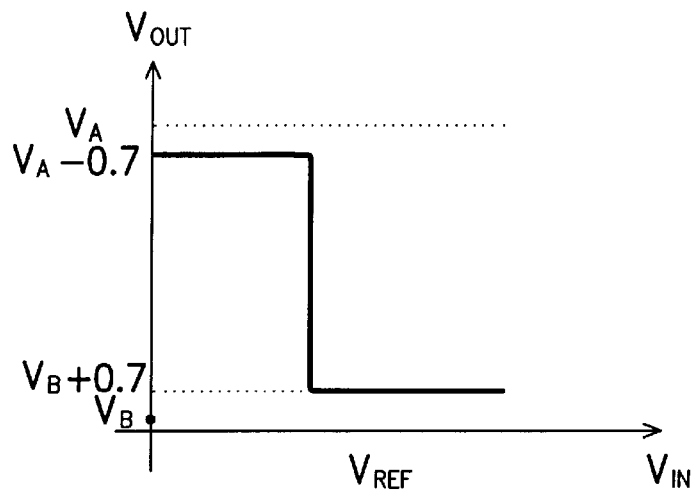
FIG. 3B is a schematic diagram of a curve of Vin-Vout in the high-speed rail-to-rail comparator of a first preferred embodiment shown in FIG. 3A.

In the first embodiment of the invention, two diodes are provided to limit a high voltage level and a low voltage level of the output signal Vout. When the voltage level of the input signal Vin is Vcc, owing to the limitation of the diode 210, the voltage of the output signal Vout is equal to about the voltage of node A ($V_A$) minus the voltage drop of the diode 210, which is about 0.7V, for example. When the voltage level of the input signal Vin is Vss, owing to the limitation of the diode 220, the voltage of the output signal Vout is equal to about the voltage of node B ($V_B$) plus the voltage drop of the diode 220, which is about 0.7V, for example. Therefore, the voltage level of the output signal Vout is limited from $V_A$ minus the voltage drop of the diode 210 to $V_B$ Plus the voltage drop of the diode 220. For example, the voltage level of the output signal Vout ranges from about $V_A-0.7V$ to $V_B+0.7V$. The Vin-Vout characteristic is depicted in FIG. 3B, which clearly shows that the output signal Vout ranges from about $V_A-0.7V$ to $V_B+0.7V$.

In the first embodiment, the diode 210 of the voltage-dropped component 200, or the diode 220 of the voltage-dropped component 205, can be replaced with two PMOS transistors. The drain terminal is connected with the gate terminal of each of the PMOS transistors, by which the PMOS transistor can be used as diode-like equivalent circuit with a characteristic of a fixed drop voltage. The source terminal and the drain terminal of the PMOS can be respectively used as a positive terminal and a negative terminal of the diode-like equivalent circuit.

The diode 210 of the voltage-dropped component 200, or the diode 220 of the voltage-dropped component 205, can also be replaced with two NMOS transistors. The drain terminal is connected with the gate terminal of each of the NMOS transistors, by which the NMOS transistor can be used as diode-like equivalent circuit with a characteristic of a fixed drop voltage. The drain terminal and the source terminal of the NMOS can be respectively used as a positive terminal and a negative terminal of the diode-like equivalent circuit.

Figure 3C:
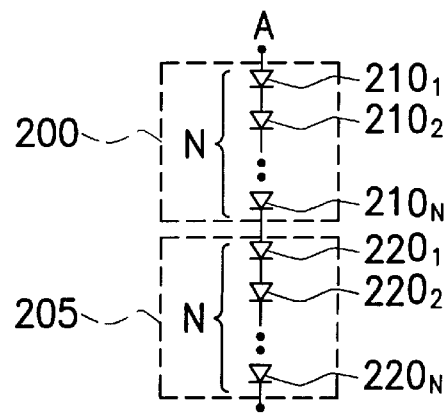
FIG. 3C is a diagram of the voltage-dropped component as shown in FIG. 3A, wherein the voltage-dropped component can be replaced with N serially connected voltage-dropped elements.

If the swing range of the output signal Vout is still larger than that required, elements of the voltage-dropped component 200, or the voltage-dropped component 205, can be easily replaced with other elements with higher voltage drops. For example, while using the diodes as elements of the voltage-dropped component 200 as shown in FIG. 3A, the diode 210 can be replaced with N serially connected diodes $210_1, 210_2, \ldots, 210_N$. While using the diodes as elements of the voltage-dropped component 205 as shown in FIG. 3A the diode 220 can be replaced with N serially connected diodes $220_1, 220_2, \ldots, 220_N$, which is shown in FIG. 3C. If voltage drops of these diodes are all about 0.7V, the voltage level of the output signal Vout is limited to a value between about $V_A-N\times0.7$ and $V_B+N\times0.7$. As mentioned above, the number N can be determined by the required swing range of voltage. In the same manner, the diodes 210 and 220 can also be replaced with N serially connected PMOS transistors or NMOS transistors, which are used as diode-like equivalent circuits.

As described in the first embodiment, if the Vcc is 3.3V, the voltage $V_A$ can be about 2V and the voltage $V_B$ can be about 1.2V. Therefore, the voltage level of the Vout can range from about 1.3V to 1.9V, by which the transferring speed of the Vout is easily faster than that in the conventional comparator.

Second embodiment

Figure 4A:
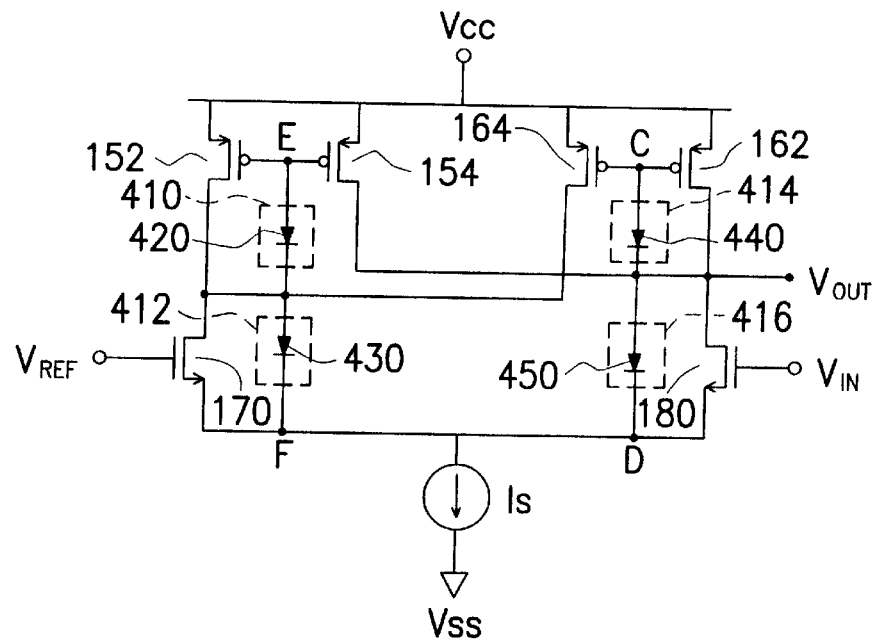
FIG. 4A a diagram of a high-speed rail-to-rail comparator of a second preferred embodiment of the invention.

Reference is made to FIG. 4A, which shows a high-speed rail-to-rail comparator 400 of a second preferred embodiment of the invention. The comparator 400 includes four PMOS transistors 152, 154, 162 and 164 and also includes two NMOS transistors 170 and 180. The source terminal of the PMOS transistor 152 is coupled to a high voltage source Vcc. The source terminal of the PMOS transistor 154 is also coupled to the high voltage source Vcc. The gate terminal of the PMOS transistor 154 is coupled to the gate terminal of the PMOS transistor 152. The source terminal of the PMOS transistor 162 is coupled to the high voltage source Vcc. The drain terminal of the PMOS transistor 162 is connected to the drain terminal of the PMOS transistor 154. The source terminal of the PMOS transistor 164 is coupled to the high voltage source Vcc. The gate terminal of the PMOS transistor 164 is connected to the gate terminal of the PMOS transistor 162 and the drain terminal of the PMOS transistor 164 is connected to the drain terminal of the PMOS transistor 152.

In addition, the drain terminal of the NMOS transistor 170 is connected to the drain terminal of the PMOS transistor 152, and the gate terminal of the NMOS transistor 170 is connected to a reference signal Vref. The drain terminal of the NMOS transistor 180 is connected to the drain terminal of the PMOS transistor 162 and a output signal Vout. The gate terminal of the NMOS transistor 180 is connected to a input signal Vin and the source terminal of the NMOS transistor 180 is connected to the source terminal of the NMOS transistor 170. A input terminal of the current source Is is connected to the source terminal of the NMOS transistor 170, and the output terminal of the current source Is is connected to a low voltage source Vss.

Voltage-dropped components 410, 412, 414 and 416 are provided in the comparator 400 of the second embodiment, as shown in FIG. 4A. The voltage-dropped components 410, 412, 414 and 416 respectively include, for example, four diodes 420, 430, 440 and 450. The positive terminal of the diode 220 is connected to the gate terminal of the PMOS transistor 152, and the negative terminal of the diode 420 is connected to the drain terminal of the NMOS transistor 170. The positive terminal of the diode 430 is connected to the drain terminal of the NMOS transistor 170, and the negative terminal of the diode 430 is connected to the source terminal of the NMOS transistor 170. The positive terminal of the diode 440 is connected to the gate terminal of the PMOS transistor 162, and the negative terminal of the diode 440 is connected to the drain terminal of the NMOS transistor 180. The positive terminal of the diode 450 is connected to the drain terminal of the NMOS transistor 180, and the negative terminal of the diode 450 is connected to the source terminal of the NMOS transistor 180.

In the second preferred embodiment of the invention, four diodes 420, 430, 440 and 450 are provided to limit a high voltage level and a low voltage level of the output signal Vout, which is never disclosed in the conventional comparator with a phenomenon of magnetic hysteresis. When the voltage level of the input signal Vin is Vcc, owing to the limitation of the diode 420 or the diode 440, the voltage of the output signal Vout is equal to about the voltage of node C ($V_C$) minus the voltage drop of the diode 420 or the diode 440, which is about 0.7V, for example.

Figure 4B:
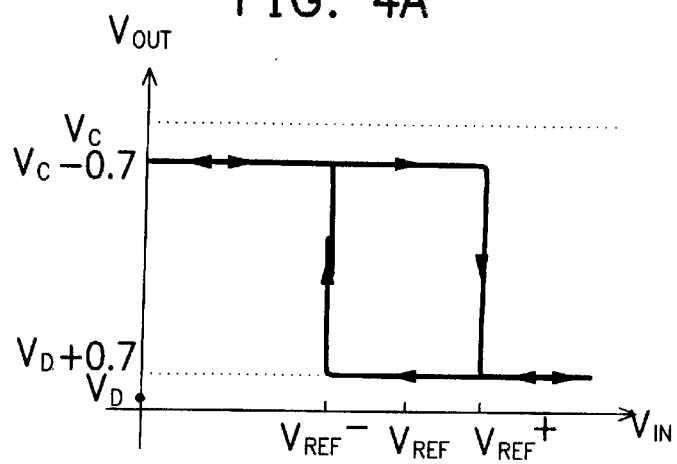
FIG. 4B is a schematic diagram of a curve of Vin-Vout in the high-speed rail-to-rail comparator of a second preferred embodiment shown in FIG. 4A.
Figure 4C:
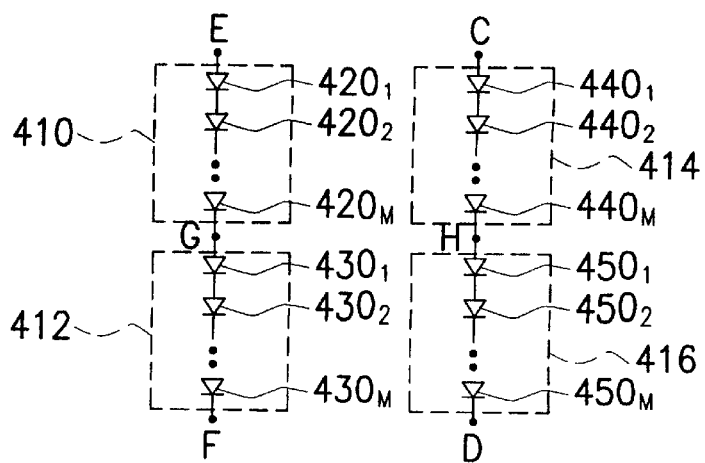
FIG. 4C is a diagram of the voltage-dropped component as shown in FIG. 4A, wherein the voltage-dropped component can be replaced with M serially connected voltage-dropped elements.

When the voltage level of the input signal Vin is Vss, owing to the limitation of the diode 430 or the diode 450, the voltage of the output signal Vout is about equal to the voltage of node D ($V_D$) plus the voltage drop of the diode 430 or the diode 450, which is about 0.7V, for example. Therefore, the voltage level of the output signal Vout is limited to a value between $V_c$ minus the voltage drop of the diode 420 or the diode 440 and $V_B$ plus the voltage drop of the diode 430 or the diode 450. For example, the voltage level of the output signal Vout ranges from about $V_c$−0.7V to $V_D$+0.7V. The Vin-Vout characteristic is depicted in FIG. 4B, which clearly shows that the output signal Vout ranges from about $V_C$−0.7V to $V_D$+0.7V.

In the second embodiment, the diodes 420, 430, 440 and 450 can be replaced with four PMOS transistors. The drain terminal is connected with the gate terminal of each of the PMOS transistors, by which the PMOS transistor can be used as diode-like equivalent circuit with a characteristic of a fixed drop voltage. The source terminal and the drain terminal of the PMOS can be respectively used as a positive terminal and a negative terminal of the diode-like equivalent circuit.

The four diodes 420, 430, 440 and 450 can also be replaced with NMOS transistors. The drain terminal is connected with the gate terminal of each of the NMOS transistors, by which the NMOS transistor can be used as diode-like equivalent circuit with a characteristic of a fixed drop voltage. The drain terminal and the source terminal of the NMOS can be respectively used as a positive terminal and a negative terminal of the diode-like equivalent circuit.

If the swing range of the output signal Vout is still larger than that required, elements of the voltage-dropped components 410, 412, 414 and 416 can be easily replaced with other elements with higher voltage drops. For example, while using the diodes as elements of the voltage-dropped component 410, 412, 414 and 416 as shown in FIG. 4a, the diode 420 can be replaced with M serially connected diodes $420_1, 420_2, \ldots, 420_M$ between the node E and the node G. The diode 430 can be replaced with M serially connected diodes $430_1, 430_2, \ldots, 430_M$ between the node G and the node F. The diode 440 can be replaced with M serially connected diodes $440_1, 440_2, \ldots, 440_M$ between the node C and the node H. The diode 450 can be replaced with M serially connected diodes $450_1, 450_2, \ldots, 450_M$ between the node H and the node D.

If voltage drops of these diodes are all 0.7V, the voltage level of the output signal Vout is limited to a value between about $V_c$−M×0.7 and $V_D$+M×0.7. As mentioned above, the number M can be determined by the required swing range of voltage. In the same manner, the diodes 420, 430, 440 and 450 can also be replaced with M serially connected PMOS transistors or NMOS transistors, which are used as diode-like equivalent circuits.

As described in the second embodiment, if the Vcc is about 3.3V, the voltages $V_c$ and $V_E$ can be about 2V and the voltages $V_D$ and $V_F$ can be about 1.2V. Therefore, the voltage level of the Vout can range from about 1.3V to 1.9V, by which the transferring speed of the Vout is easily faster than that in the conventional comparator.

As disclosed in the first and second preferred embodiment, the invention provides a high-speed rail-to-rail comparator, in which a voltage-dropped component is employed between connection of the output terminal and the active loads of the comparator. By employing the voltage-dropped component, a voltage level of the output terminal of the comparator can be easily controlled at a required level. For example, when a high voltage source is applied to the comparator, the voltage level of the output terminal of the comparator can be decreased, and when a low voltage source is applied to the comparator, the voltage level of the output terminal of the comparator can be increased.

Additionally, the invention provides a high-speed rail-to-rail comparator, in which a voltage-dropped component is employed between connection of the output terminal and the common source terminal of the comparator. By employing the voltage-dropped component, a swing range of the output voltage of the comparator can be controlled and limited, by which the transferring speed of the output of the comparator can be easily faster than that in the conventional comparator. This invention is therefore suitable for application in a high-speed circuit.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A high-speed rail-to-rail comparator, comprising:
    a first PMOS transistor, wherein a source terminal of the PMOS transistor is coupled to a first voltage source and a gate terminal and a drain terminal of the first PMOS transistor are coupled to each other;
    a second PMOS transistor, wherein a source terminal of the second PMOS transistor is coupled to the first voltage source and a gate terminal of the second PMOS transistor is coupled to the gate terminal of the first PMOS transistor;
    a first NMOS transistor, wherein a drain terminal of the first NMOS transistor is coupled to the drain terminal of the first PMOS transistor, and a gate terminal of the first NMOS transistor is coupled to a reference signal;
    a second NMOS transistor, wherein a drain terminal of the second NMOS transistor is coupled to the drain terminal of the second PMOS transistor and coupled to an output terminal, wherein a gate terminal of the second NMOS transistor is coupled to an input terminal and a source terminal of the second NMOS transistor is coupled to a source terminal of the first NMOS transistor;
    a current source, wherein an input terminal of the current source is coupled to the source terminal of the first NMOS transistor, an output terminal of the current source is coupled to a second voltage source, and the voltage provided by the first voltage source is larger than the voltage provided by the second voltage source;
    a first voltage-dropped component, wherein a positive terminal of the first voltage-dropped component is coupled to the gate terminal of the second PMOS transistor and a negative terminal of the first voltage-dropped component is coupled to the drain terminal of the second NMOS transistor; and
    a second voltage-dropped component, wherein a positive terminal of the second voltage-dropped component is coupled to the drain terminal of the second NMOS transistor and a negative terminal of the second voltage-dropped component is coupled to the source terminal of the second NMOS transistor.

2. The high-speed rail-to-rail comparator as claimed in claim 1, wherein the first and second voltage-dropped components are diodes, a terminal connected to a p-type junction of each of the first and second voltage-dropped components is the positive terminal of each of the first and second voltage-dropped components, and a terminal connected to an n-type junction of each of the first and second voltage-dropped components is the negative terminal of each of the first and second voltage-dropped components.

3. The high-speed rail-to-rail comparator as claimed in claim 1, wherein the first and second voltage-dropped components are NMOS transistors, a drain terminal and a gate terminal of the NMOS transistor are connected with each other, the drain terminal of the NMOS transistor is the positive terminal of each of the first and second voltage dropped components, and the source terminal of the NMOS transistor is the negative terminal of each of the first and second voltage-dropped components.

4. The high-speed rail-to-rail comparator as claimed in claim 1, wherein the first and second voltage-dropped components are PMOS transistors, wherein a drain terminal and a gate terminal of the PMOS transistor are connected with each other, the source terminal of the PMOS transistor is the positive terminal of each of the first and second voltage-dropped components, and the drain terminal of the PMOS transistor is the negative terminal of each of the first and second voltage-dropped components.

5. The high-speed rail-to-rail comparator as claimed in claim 1, wherein each of the first and second voltage-dropped components comprises a plurality of serially connected voltage-dropped elements wherein a negative terminal of each of the serially connected voltage-dropped elements is connected with a positive terminal of a next one of the serially connected voltage-dropped elements, a positive terminal of a first one of the serially connected voltage-dropped elements is the positive terminal of the voltage-dropped component, and a negative terminal of a last one of the serially connected voltage-dropped elements is the positive terminal of the voltage-dropped component.

6. The high-speed rail-to-rail comparator as claimed in claim 5, wherein each voltage-dropped element is a diode, a terminal connected to a p-type junction of the voltage-dropped element is the positive terminal of the voltage-dropped element, and a terminal connected to an n-type junction of the voltage-dropped element is the negative terminal of the voltage-dropped element.

7. The high-speed rail-to-rail comparator as claimed in claim 5, wherein each voltage-dropped element is a NMOS transistor, a drain terminal and a gate terminal of the NMOS transistor are connected with each other, the drain terminal of the NMOS transistor is the positive terminal of the voltage-dropped element, and the source terminal of the NMOS transistor is the negative terminal of the voltage-dropped element.

8. The high-speed rail-to-rail comparator as claimed in claim 5, wherein each voltage-dropped element is a PMOS transistor, wherein a drain terminal and a gate terminal of the PMOS transistor are connected with each other, the source terminal of the PMOS transistor is the positive terminal of the voltage-dropped element, and the drain terminal of the PMOS transistor is the negative terminal of the voltage-dropped element.

9. A high-speed rail-to-rail comparator, comprising:
a first PMOS transistor, wherein a source terminal of the first PMOS transistor is coupled to a first voltage source;
a second PMOS transistor, wherein a source terminal of the second PMOS transistor is coupled to the first voltage source and a gate terminal of the PMOS transistor is coupled to a gate terminal of the first PMOS transistor;
a third PMOS transistor, wherein a source terminal of the third PMOS transistor is coupled to the first voltage source and a drain terminal of the third PMOS transistor is coupled to a drain terminal of the second PMOS transistor;
a fourth PMOS transistor, wherein a source terminal of the fourth PMOS transistor is coupled to the first voltage source, a gate terminal of the fourth PMOS transistor is coupled to a gate terminal of the third PMOS transistor and a drain terminal of the fourth PMOS transistor is coupled to a drain terminal of the first PMOS transistor;
a first NMOS transistor, wherein a drain terminal of the first NMOS transistor is coupled to a drain terminal of the first PMOS transistor and a gate terminal of the first NMOS transistor is coupled to a reference signal;
a second NMOS transistor, wherein a drain terminal of the second NMOS transistor is coupled to the drain terminal of the third PMOS transistor and an output terminal, a gate terminal of the second NMOS transistor is coupled to an input terminal, and a source terminal of the second NMOS transistor is coupled to a source terminal of the first NMOS transistor;
a current source, wherein a input terminal of the current source is coupled to the source terminal of the first NMOS transistor, and an output terminal of the current source is coupled to a second voltage source;
a first voltage-dropped component, coupled between a gate terminal of the first PMOS transistor and the source terminal of the first NMOS transistor, wherein a positive terminal of the first voltage-dropped component is coupled to the gate terminal of the first PMOS transistor and a negative terminal of the first voltage-dropped component is coupled to the drain terminal of the first NMOS transistor;
a second voltage-dropped component, coupled between the drain terminal of the first NMOS transistor and the source terminal of the first NMOS transistor, wherein a positive terminal of the first voltage-dropped component is coupled to the drain terminal of the first NMOS transistor and a negative terminal of the first voltage-dropped component is coupled to the source terminal of the first NMOS transistor;
a third voltage-dropped component, coupled between the gate terminal of the third PMOS transistor and the drain terminal of the second NMOS transistor, wherein a positive terminal of the first voltage-dropped component is coupled to the gate terminal of the third PMOS transistor and a negative terminal of the first voltage-dropped component is coupled to the drain terminal of the second NMOS transistor; and
a fourth voltage-dropped component, coupled between the drain terminal of the second NMOS transistor and the source terminal of the second NMOS transistor, wherein a positive terminal of the first voltage-dropped component is coupled to the drain terminal of the second NMOS transistor and a negative terminal of the first voltage-dropped component is coupled to the source terminal of the second NMOS transistor.

10. The high-speed rail-to-rail comparator as claimed in claim 9, wherein the voltage-dropped component is a diode, a terminal connected to a p-type junction of the voltage-dropped components is the positive terminal of the voltage-dropped component, and a terminal connected to an n-type junction of the voltage-dropped component is the negative terminal of the voltage-dropped components.

11. The high-speed rail-to-rail comparator as claimed in claim 9, wherein the voltage-dropped component is a NMOS transistor, a drain terminal and a gate terminal of the NMOS transistor are connected with each other, and the drain terminal of the NMOS transistor is the positive terminal of the voltage-dropped component, wherein the source terminal of the NMOS transistor is the negative terminal of the voltage-dropped component.

12. The high-speed rail-to-rail comparator as claimed in claim 9, wherein the voltage-dropped component is a PMOS transistor, a drain terminal and a gate terminal of the PMOS transistor are connected with each other, the source terminal of the PMOS transistor is the positive terminal of the voltage-dropped component, and the drain terminal of the PMOS transistor is the negative terminal of the voltage-dropped component.

13. The high-speed rail-to-rail comparator as claimed in claim 9, wherein the voltage-dropped component comprises a plurality of serially connected voltage-dropped elements, wherein a negative terminal of each of the serially connected voltage-dropped elements is connected with a positive terminal of the next one of the serially connected voltage-dropped elements, wherein a positive terminal of a first one of the serially connected voltage-dropped elements is the positive terminal of the voltage-dropped component, wherein a negative terminal of a last one of the serially connected voltage-dropped elements is the positive terminal of the voltage-dropped component.

14. The high-speed rail-to-rail comparator as claimed in claim 13, wherein each voltage-dropped element is a diode, a terminal connected to a p-type junction of the voltage-dropped element is the positive terminal of the voltage-dropped element, and a terminal connected to an n-type junction of the voltage-dropped element is the negative terminal of the voltage-dropped element.

15. The high-speed rail-to-rail comparator as claimed in claim 13, wherein each voltage-dropped element is a NMOS transistor, wherein a drain terminal and a gate terminal of the NMOS transistor are connected with each other, the drain terminal of the NMOS transistor is the positive terminal of the voltage-dropped element, and the source terminal of the NMOS transistor is the negative terminal of the voltage-dropped element.

16. The high-speed rail-to-rail comparator as claimed in claim 13, wherein each voltage-dropped element is a PMOS transistor, wherein a drain terminal and a gate terminal of the PMOS transistor are connected with each other, the source terminal of the PMOS transistor is the positive terminal of the voltage-dropped element, and the drain terminal of the PMOS transistor is the negative terminal of the voltage-dropped element.

* * * * *